United States Patent
Nikitin et al.

(10) Patent No.: US 8,362,617 B2
(45) Date of Patent: *Jan. 29, 2013

(54) SEMICONDUCTOR DEVICE

(75) Inventors: Ivan Nikitin, Regensburg (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

This patent is subject to a terminal disclaimer.

(21) Appl. No.: 12/113,282

(22) Filed: May 1, 2008

(65) Prior Publication Data

US 2009/0273063 A1    Nov. 5, 2009

(51) Int. Cl.
H01L 23/48    (2006.01)

(52) U.S. Cl. ......... 257/773; 257/700; 438/618; 438/666

(58) Field of Classification Search ........... 257/773
See application file for complete search history.

(56) References Cited

U.S. PATENT DOCUMENTS

| | | | |
|---|---|---|---|
| 5,108,785 A | 4/1992 | Lincoln et al. | |
| 5,847,467 A * | 12/1998 | Wills et al. | 257/789 |
| 5,955,179 A | 9/1999 | Kickelhain et al. | |
| 6,900,538 B2 * | 5/2005 | Alter et al. | 257/738 |
| 7,479,691 B2 | 1/2009 | Ewe et al. | |
| 7,514,778 B2 | 4/2009 | Otremba et al. | |
| 2001/0008794 A1 * | 7/2001 | Akagawa | 438/620 |
| 2003/0111721 A1 * | 6/2003 | Nakanishi et al. | 257/686 |
| 2004/0140549 A1 | 7/2004 | Miyagawa | |
| 2005/0001329 A1 * | 1/2005 | Matsuki et al. | 257/777 |
| 2005/0199994 A1 * | 9/2005 | Morishita et al. | 257/686 |
| 2006/0205112 A1 | 9/2006 | Standing et al. | |
| 2006/0220673 A1 * | 10/2006 | Hiranuma et al. | 326/27 |
| 2009/0072379 A1 | 3/2009 | Ewe et al. | |

FOREIGN PATENT DOCUMENTS

| | | |
|---|---|---|
| DE | P 28 49 716.7 A1 | 11/1978 |
| DE | 10255520 A1 | 6/2004 |
| DE | 102004047306 | 4/2006 |
| DE | 10 2006 040 352.5 B3 | 8/2006 |
| DE | 102006012007 A1 | 9/2006 |
| DE | 102008045338 | 4/2009 |
| WO | 03/058677 A2 | 7/2003 |
| WO | 03/059027 A1 | 7/2003 |
| WO | 2006/010639 A2 | 2/2006 |

OTHER PUBLICATIONS

"Laser Micro-Sintering as a New Metallization Technique for Silicon Solar Cells," M. Aleman et al., From Fraunhofer Institute for Solar Energy Systems (Heidenhofstr. 2, D-79110 Freiburg, Germany) and Laser Institut Mittelsachsen (Technikumplatz 17, 09648 Mittweida, Germany), 4 pages.

* cited by examiner

Primary Examiner — Ajay K Arora

(74) Attorney, Agent, or Firm — Dicke, Billig & Czaja, PLLC

(57) ABSTRACT

One embodiment provides a semiconductor device including a carrier, a first chip attached to the carrier, a structured dielectric coupled to the chip and to the carrier, and a conducting element electrically connected with the chip and extending over a portion of the structured dielectric. The conducting element includes a sintered region.

15 Claims, 13 Drawing Sheets

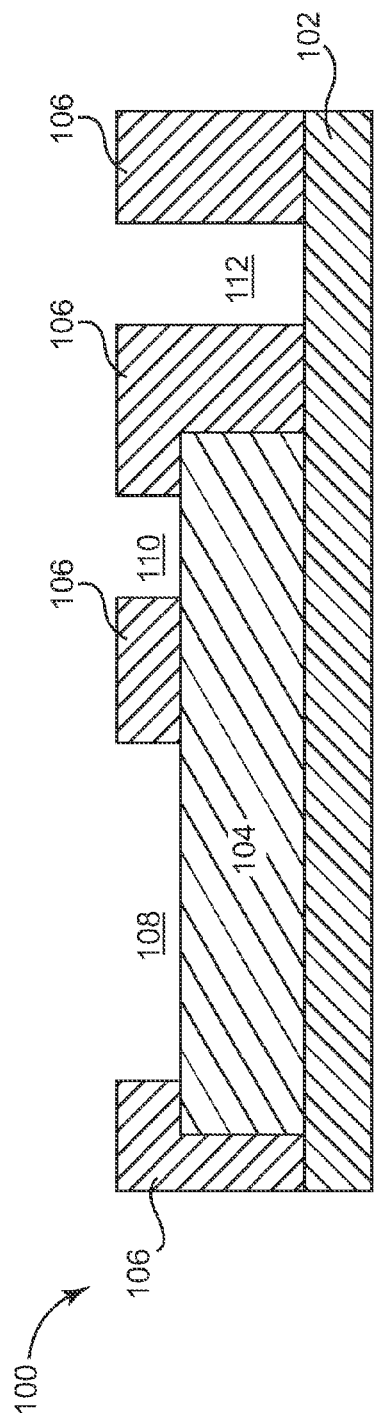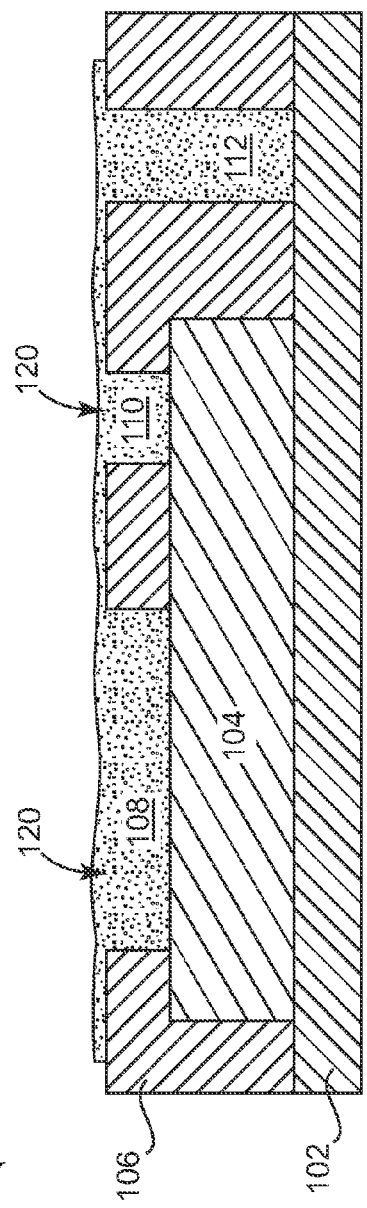
Fig. 12
Fig. 13

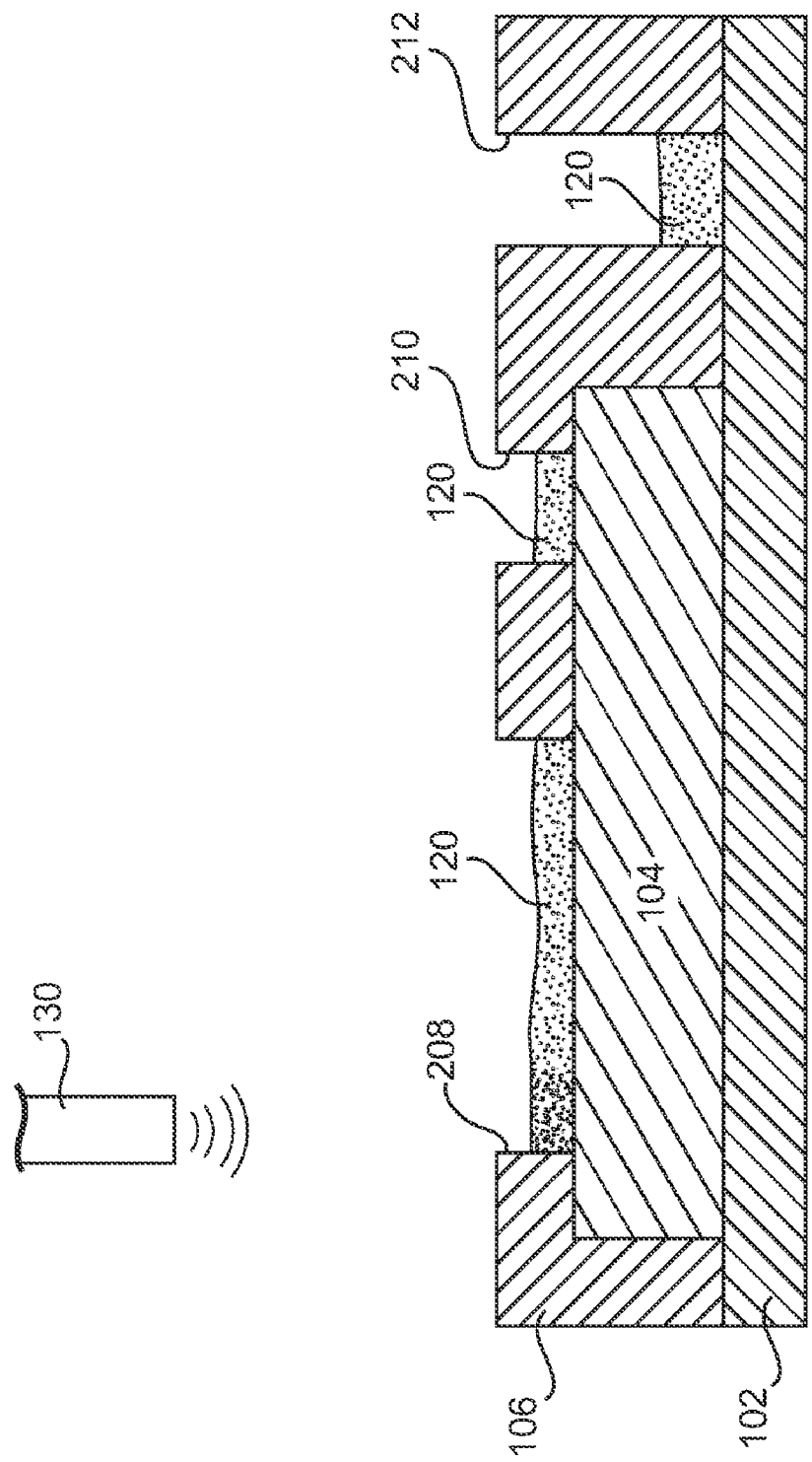

SEMICONDUCTOR DEVICE

BACKGROUND

Market demand for smaller and more functional electronic devices has driven the development of semiconductor devices, including semiconductor power packages and entire systems disposed on a chip. Some electronic devices, such as cellular telephones, employ a variety of design-specific electronic components. Other electronic devices, such as power packages utilized in the automotive industry, employ one or more logic chips connected to a leadframe and one or more power transistors connected to the leadframe and the logic chip(s). The space available inside the electronic devices is limited, particularly as the electronic devices are made smaller.

Wire bonds are employed in some known semiconductor packages to electrically connect chips to the carrier. The wire bonds are time consuming to connect, but when complete, provide a first level interconnect communicating between the chip and the outside world. These conventional interposer-based semiconductor packages have a relatively low input/output density.

Photolithographic-fabricated conducting lines are employed with other known semiconductor packages to electrically connect chips to chips and chips to the carrier. The conducting lines are formed with photolithographic masking, deposition of metal relative to the masking, and removal of the masking to reveal metal lines. Photolithographic formation of conducting lines can be expensive due to the exacting application of masks and the exacting tolerances of the deposition of the electrical conducting material.

Both the manufacturers and consumers of electronic devices desire devices that are reduced in size and yet have increased device functionality.

For these and other reasons there is a need for the present invention.

SUMMARY

One aspect provides a semiconductor device including a carrier, a first chip attached to the carrier, a structured dielectric coupled to the chip and to the carrier, and a conducting element electrically connected with the chip and extending over a portion of the structured dielectric. The conducting element includes a sintered region.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 12 is a cross-sectional view of a device including a leadframe, a semiconductor chip attached to the leadframe, and a structured dielectric patterned to include vias.

FIG. 13 is a cross-sectional view of metal particles deposited in the vias shown in FIG. 12.

FIG. 16A is a cross-sectional view of a high energy source making multiple passes over metal particles deposited into vias.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In this specification, the phrases "comprising a . . . " and "comprising an . . . " are each to mean a set including one or more.

Embodiments provide a semiconductor device fabricated in a direct process to include a sintered conducting element electrically connected to one or more chips of the semiconductor device. Embodiments provide a method of fabricating a semiconductor device including metal lines extending between chips of the semiconductor device, where the metal lines are sintered in a one step process to provide electrically conducting elements coupled between chips and between chips and a carrier of the semiconductor device.

Other embodiments provide a fabricated semiconductor device including a high voltage metal line extending between a power transistor of the semiconductor device and the carrier, where the high voltage metal line is sintered by an energy source directed to a metal powder. Multiple passes of the energy source are selectively guided over the device to selectively form a desired width of the high voltage metal line.

Embodiments provide a fully additive sintering process that can be employed to first laser ablate an opening or a via into a substrate, and subsequently sinter metal particles deposited into the via. In this manner, large open structures above a chip in a semiconductor device may be filled with sintered metal, or optional bump geometries may be applied from metals or ceramics to active surfaces of semiconductor chips.

Figure 1:
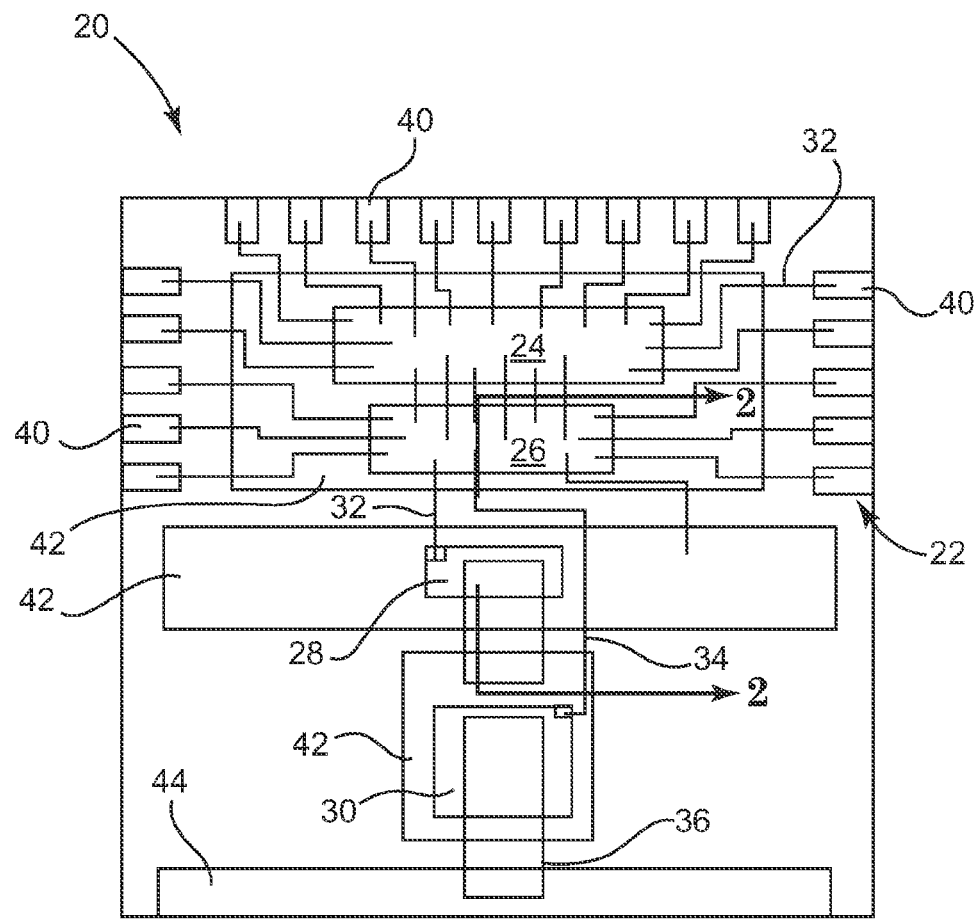
FIG. 1 is a top view of a semiconductor device power package according to one embodiment.

FIG. 1 is a top view of a semiconductor device power package 20 according to one embodiment. Semiconductor device power package 20 includes a carrier 22, chips 24, 26, 28, 30 coupled to carrier 22, a conducting element 32 extending between chip 24 and carrier 22, a conducting element 34 extending between chip 26 and chip 30, and a conducting element 36 extending between chip 30 and carrier 22. Other suitable electrical connections between chips 24, 26, 28, 30 and carrier 22 are also acceptable.

In one embodiment, carrier 22 includes a leadframe having a plurality of connection heads 40, one or more islands 42, and one or more connection strips 44. In one embodiment, carrier 22 includes a leadframe stamped from a plate of copper or other suitable conductor to include contact pads 40, islands 42 and connection strip 44. The components of carrier 22 are retained in a desired orientation until chips 24, 26, 28, and 30 are attached to islands 42 and appropriately electrically connected. In general, carrier 22 provides a support structure for package 20 and includes leadframes formed of metal such as copper, aluminum, alloys of copper, alloys of aluminum, or other suitable electrically conducting metals. In one embodiment, leadframe 22 includes a quad flat no-lead (QFN) leadframe having leads 40 on more than two sides. In another embodiment, leadframe 22 includes a dual flat no-lead (DFN) leadframe having leads 40 on two opposing sides. Other suitable carriers are also acceptable.

In one embodiment, chips 24 and 26 are logic chips and chips 28 and 30 are power transistors. Power transistors 28, 30 include wider conducting elements 36 electrically coupled to carrier 22 that are configured to bring power from the outside world to drive chips 24, 26. In one embodiment, chip 24 is a controller chip and chip 26 is a driver chip, where chips 24, 26 provide logic and processing for semiconductor device package 20. Other suitable forms and styles of chips 24, 26 and chips 28, 30 are also acceptable.

Conducting elements 32, 34, 36 electrically connect components disposed on carrier 22 to the outside world. In one embodiment, conducting elements 32, 34, 36 are sintered metallic lines accurately traced onto carrier 22 and coupled to chips 24, 26, 28, and 30 in a direct process. Conducting element 32 is generally an electrically conducting element having a line width of between about 1-20 micrometers and couples between one or more chips 24, 26, 28, 30 or between chips 24, 26, 28, 30 and one or more pads 40 of carrier 22. Conducting element 36 is fabricated to be wider than conducting element 32, and in one embodiment conducting element 36 is a high voltage sintered line having a width of between about 15-50 micrometers and is electrically coupled between power transistors 28, 30 and carrier 22.

Figure 2:
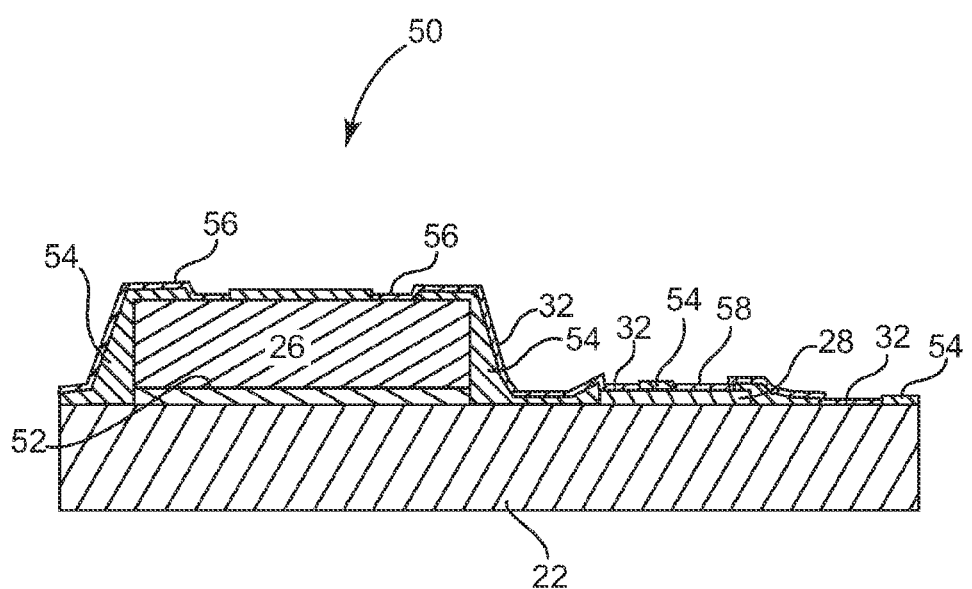
FIG. 2 is a cross-sectional view of a portion of the semiconductor device power package shown in FIG. 1.

FIG. 2 is a cross-sectional view of a portion of semiconductor device power package 20 taken along line 2-2 of FIG. 1. The cross-section represents a semiconductor device 50 including logic chip 26 and power transistor 28 attached to carrier 22 and including conducting element 32 electrically coupling logic chip 26 and power transistor 28.

In one embodiment, logic chip 26 is attached to carrier 22 by an adhesive 52 or other suitable attachment material. Power transistor 28 is likewise attached to carrier 22 and in one embodiment is adhesively attached and in another embodiment is vertically integrated into carrier 22. A structured dielectric 54 is deposited around and over logic chip 26 and power transistor 28. Embodiments provided herein and described below include a sintered conducting element 32 electrically connected to logic chip 26 and power transistor 28 and extending over a portion of structured dielectric 54. In one embodiment, conducting element defines an uppermost contact surface 56 of chip 26 and conducting element 32 is sintered between chip 26 and uppermost contact surface 56. In other words, an entire depth of conducting element 32 is sintered between chip 26 and uppermost contact surface 56. Similarly, conducting element 32 is sintered between power transistor 28 and an uppermost surface 58 of transistor 28.

Figure 3:
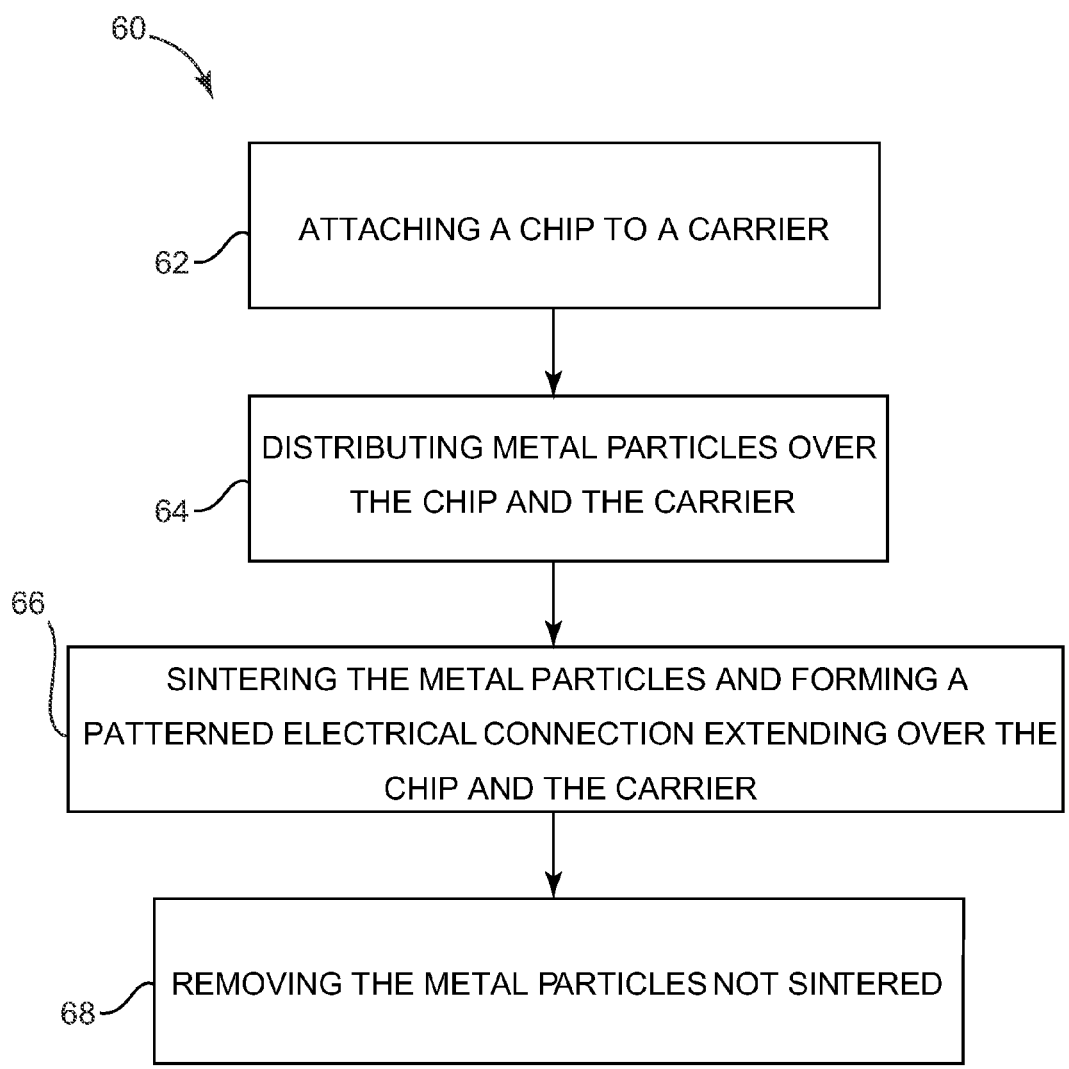
FIG. 3 is a block diagram of a method of manufacturing a semiconductor device according to one embodiment.

FIG. 3 is a block diagram 60 of a method of manufacturing a semiconductor device according to one embodiment. Block diagram 60 includes attaching a chip to a carrier at 62 and distributing metal particles over the chip and the carrier at 64. Embodiments described above include distributing metal particles over the chip, over the carrier, and over a structured dielectric deposited around the chip. Block diagrams 60 additionally includes sintering the metal particles and forming a patterned electrical connection extending over the chip and the carrier at 66. Block diagram 60 further includes removing the metal particles that have not been sintered at 68. Block diagram 60 provides one method for manufacturing a semiconductor device in which conducting electrical lines having improved electrical properties are formed in a one step, additive process by energetically sintering metal particles distributed over a semiconductor device. It is desired to selectively control the width and thickness of the sintered patterned electrical connection, for example by tracing the distributed metal particles with a laser beam to form the electrical connection. Any metal particles not sintered are suited for removal and reuse (i.e., recycled for use) in a later sintering process.

FIG. 4 through FIG. 7 describe one method of manufacturing a semiconductor device employing sintered conducting elements electrically connecting components of the device.

Figure 4:
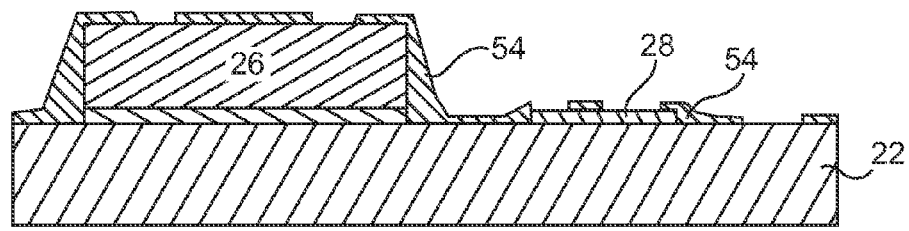
FIG. 4 is a cross-sectional view of a semiconductor device including a structured dielectric material formed over portions of a logic chip and a power transistor attached to a leadframe according to one embodiment.

FIG. 4 is a cross-sectional view of a structured dielectric 54 patterned over chips 26, 28 that are attached to carrier 22. Structured dielectric 54 includes suitable low k-dielectrics or other electrically non-conducting materials. Suitable materials for structured dielectric 54 include $SiO_2$ or $Al_2O_3$, or plastics such as epoxy or polyimide, although other dielectrics useful in semiconductor packaging are also acceptable. In one embodiment, dielectric 54 is structured by laser ablation. Other suitable processes for patterning dielectric 54, such as photolithographic patterning, are also acceptable.

Figure 5:
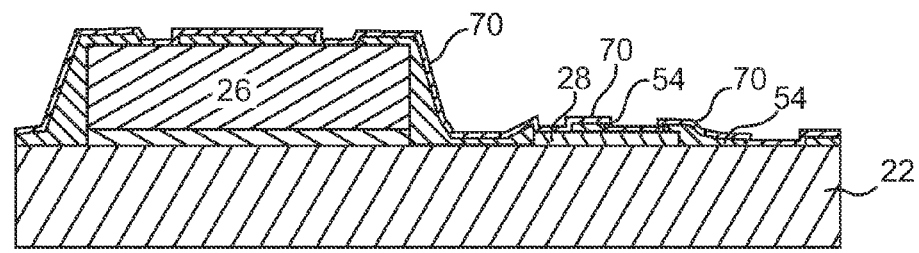
FIG. 5 is a cross-sectional view of the semiconductor device shown in FIG. 4 including metal particles distributed over an upper surface of the device.

FIG. 5 is a cross-sectional view of a metal powder 70 distributed over structured dielectric 54, chips 26, 28, and carrier 22. Suitable metal powders 70 include silver powder, gold powder, nickel powder, copper powder, or other suitable electrically conducting metals provided in a powdered form. In one embodiment, metal powder 70 is silver powder that is evenly distributed over an upper surface of carrier 22, chips 26, 28 and dielectric 54. Silver has a low susceptibility to oxidation. Silver powder is suited for distribution over the upper surfaces of chips 26, 28 and carrier 22 without special consideration for the local atmosphere. In other embodiments, copper powder is evenly distributed over components placed on carrier 22 and is preferably deposited in an inert atmosphere such as a nitrogen atmosphere.

Metal powder 70 is selected to have a particle size of between about 2 nanometers (nm) to 10 micrometers (μm), and preferably the particle size is between about 5 nm to 1 μm. In one embodiment, metal powder 70 includes silver particles having an average particle size of about 5 nanometers that are subsequently sintered by a high energy process to provide a conducting line having a width between about 20-50 micrometers and a thickness between about 1-5 micrometers. It has been discovered that particle sizes of less than 50 nm reduce the sintering temperature significantly, and that particle sizes of about 5 nm reduce the sintering temperature to less than about $\frac{1}{3}$ of the melting point for the alloy in a manner that sintering is done without pressure. It is desired that the porosity of the metal powder 70 be minimized, which results in the thermal and electrical performance being maximized.

Figure 6:
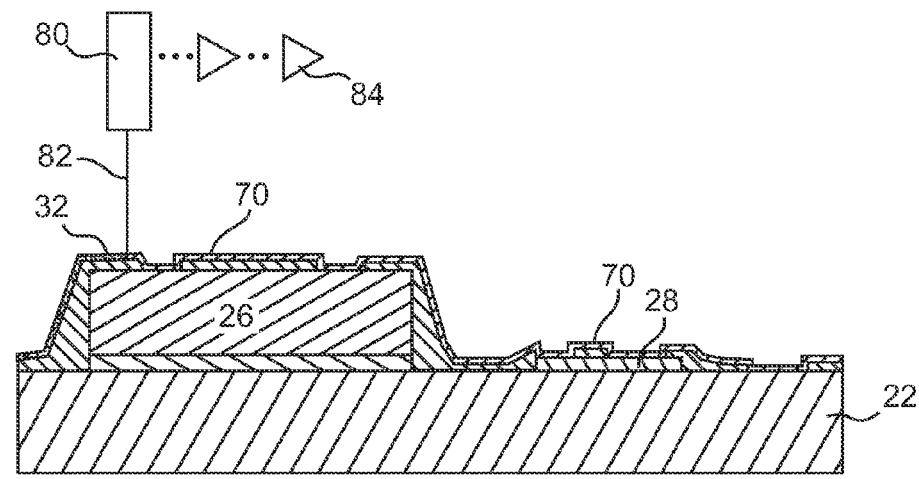
FIG. 6 is a cross-sectional view of the device shown in FIG. 5 having a laser beam directed to and configured to sinter the metal particles into an electrical line.

FIG. 6 is a cross-sectional view of a laser 80 directing a laser beam 82 along a surface of logic chip 26. Laser 80 is directed in a path to the right for example, as indicated by arrows 84. Laser beam 82 moves along the surface of chip 26 and sinters the metal powder 70 in contact with beam 82. The particles in powder 70 that are energetically affected by beam 82 are sintered to form conducting element 32. The particles of powder 70 that are not sintered by laser 80 are removed from chip 26 and carrier 22 by a suitable removal process, such as washing, air pistol, etc.

In one embodiment, laser 80 includes a neodymium-doped yttrium aluminum garnet (Nd:YAG) solid state laser, a $CO_2$ or gas laser, a diode laser, or other suitable electron beam high energy source. In one embodiment, the Nd:YAG laser has a power between 100-2000 watts operating at a speed between 40-80 mm/s, although other suitable lasers operated at other powers and transport speeds are also acceptable. In general the Nd:YAG laser emits light at a wave length of about 1064 nanometers in the infrared spectrum, although transitions near the 940, 1120, 1320, and 1440 nanometer range are present. Suitable lasers may be operated in both pulsed and/or continuous mode. One suitable Nd:YAG laser is available from Han's Laser Technology Company, Houston, Tex.

Figure 7:
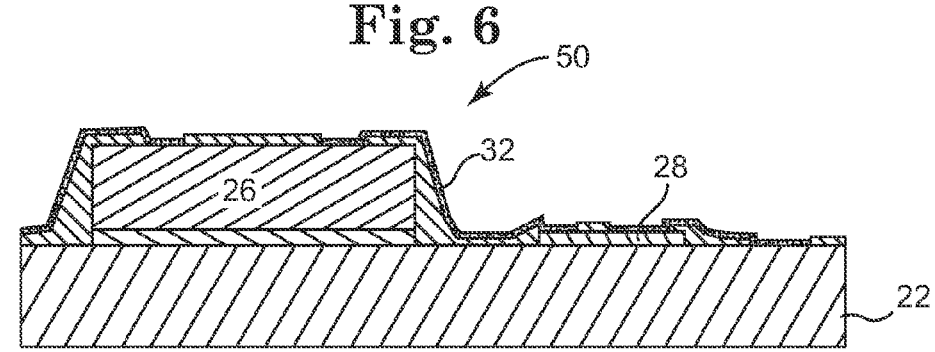
FIG. 7 is a cross-sectional view of a semiconductor device power package including a sintered conducting element extending between a logic chip and a power transistor over a non-planar structured dielectric.

FIG. 7 is a cross-sectional view of a fabricated semiconductor device 50 including conducting element 32 electrically connecting logic chip 26 and power transistor 28. In one embodiment, conducting element 32 electrically connects chip 26 to transistor 28 and extends over a portion of a non-planar structured dielectric 54. In contrast to conventional lithographic approaches, conducting element 32 is configured to be relatively thin compared to the thickness of chip 26 and chip 28. That is to say, dielectric 54 need not be patterned through its entire thickness. In addition, conducting element 32 is conforms to (i.e., is conformally deposited over) structured dielectric 54 in a one-pass process.

FIG. 8 through FIG. 11 are top views of a method of fabricating a semiconductor device according to one embodiment.

Figure 8:
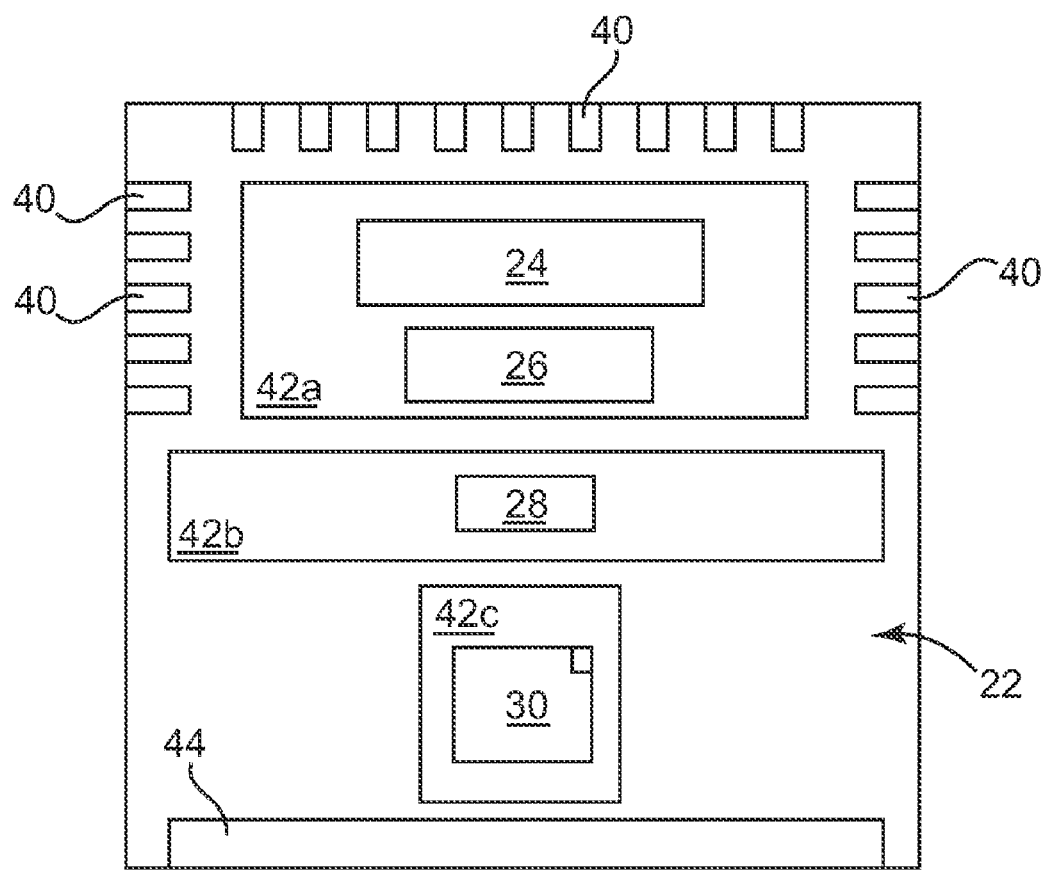
FIG. 8 is a top view of a leadframe and multiple semiconductor chips attached to the leadframe according to one embodiment.

FIG. 8 is a top view of carrier 22 including contact pads 40, islands 42, and connection strip 44. In one embodiment, carrier 22 is stamped from a metal plate including tiebars (not shown) or other supports configured to enable carrier 22 to be directed through assembly steps. Logic chips 24, 26 are attached to island 42a, power transistor 28 is attached to island 42b, and power transistor 30 is attached to island 42c.

Figure 9:
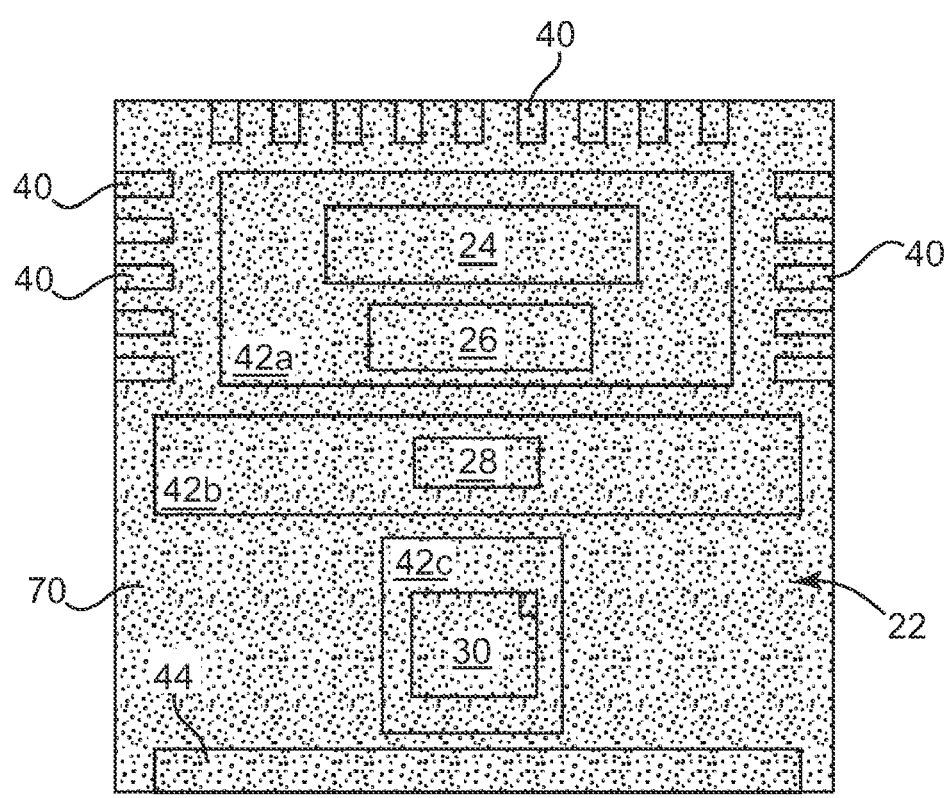
FIG. 9 is a top view of the leadframe and chips shown in FIG. 8 including a uniform deposition of metal powder deposited over the chips and the leadframe.

FIG. 9 is a top view of powder 70 distributed over carrier 22 and chips 24, 26, 28, 30. It is to be understood that powder 70 is also distributed structured dielectric 54 (FIG. 4) when dielectric 54 is patterned between one or more chips or between chips and leadframe 22. In any regard powder 70 is evenly distributed over an uppermost surface of the components on top of carrier 22.

In one embodiment, carrier 22 and the components attached to carrier 22 are maintained at an electrostatic potential, and powder 70 is dusted onto the carrier 22 such that the powder 70 is attracted to and evenly distributes over carrier 22 and the components on carrier 22. For example, in one embodiment structured dielectric 54 (FIG. 4) creates a static potential by virtue of the plastic portion of dielectric 54 having a different electric potential than powder 70. In another embodiment, carrier 22 is placed on a surface or is electrically connected to a source that develops an electrical potential for carrier 22 such that the components on carrier 22 attract powder 70. In other embodiments, some or all of the components attached to carrier 22 are configured to magnetically attract powder 70.

Figure 10:
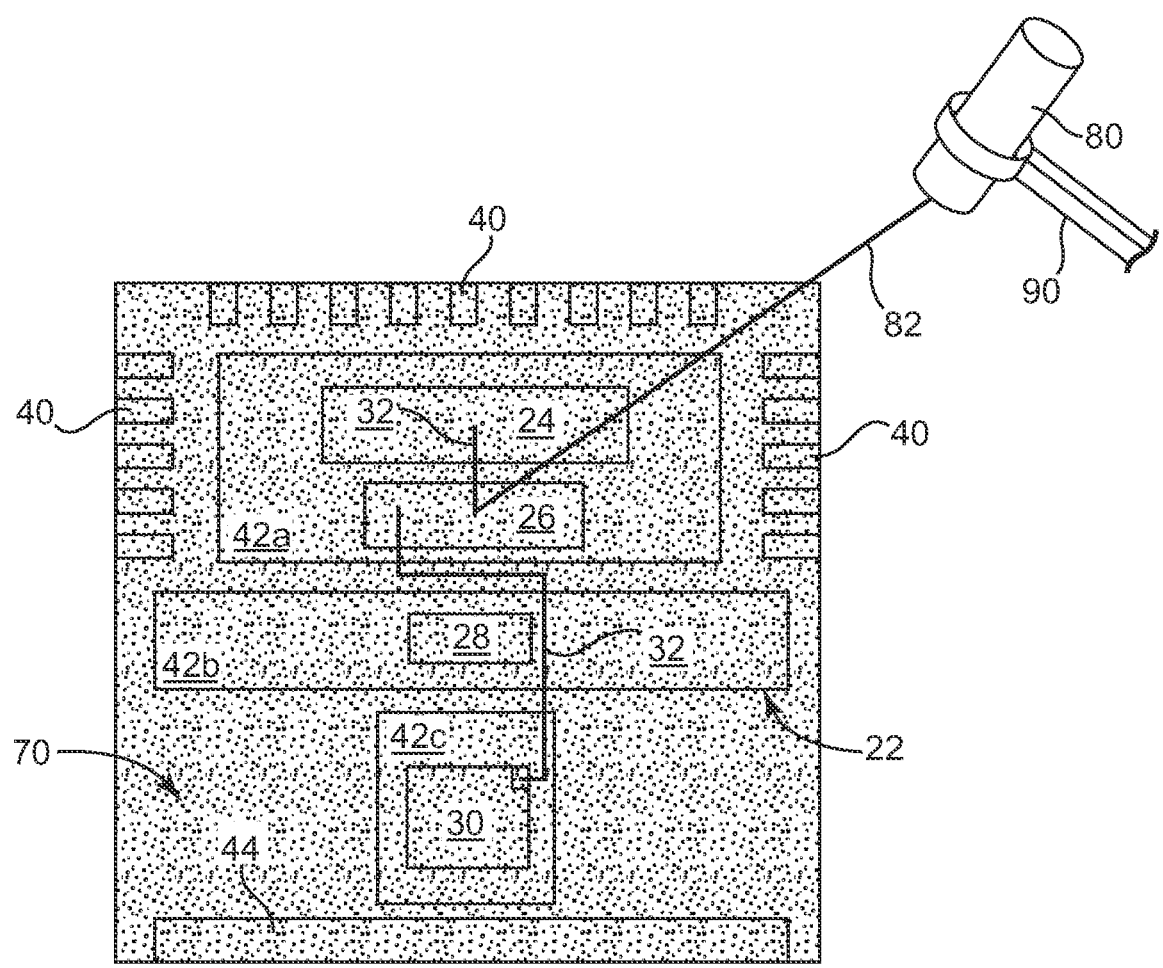
FIG. 10 is a top view of the leadframe and chips shown in FIG. 9 including a laser beam tracing a conduction path through the particles.

FIG. 10 is a top view of powder 70 distributed over carrier 22 and laser 80 directing laser beam 82 to a portion of the powder 70. Laser beam 82 provides focused energy that locally heats powder 70, fusing or sintering the metal particles of powder 70 together in the focused region affected by laser beam 82. In this manner, only the metal powder 70 that is contacted by laser beam 82 is sintered to form a conducting element 32. In one embodiment, laser 80 is attached to a moveable arm 90 that is programmed (e.g., as a computer controlled device) to move in a selected and directed pattern to form a wiring path of conducting elements 32 on carrier 22. Suitable forms for controlling moveable arm 90 include computer assisted machining devices employed to move laser beam 82 in a calculated path to selectively sinter metal powder 70 in a wiring pattern of conducting elements 32.

Figure 11:
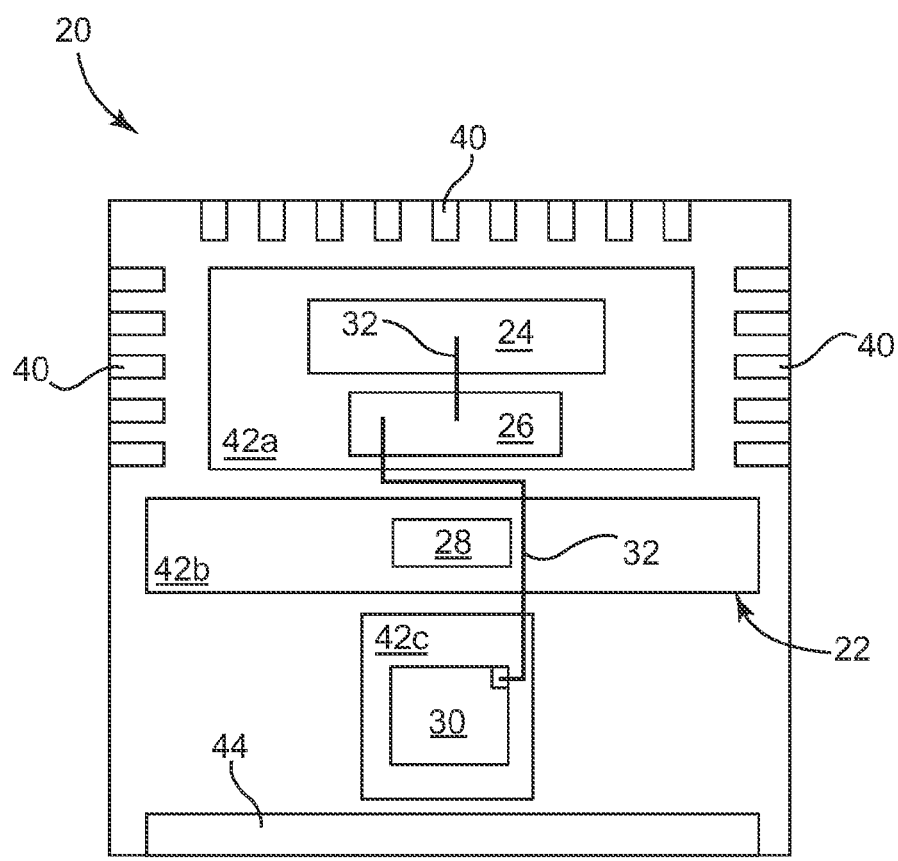
FIG. 11 is a top view of a portion of a semiconductor device power package including a conducting element extending between two logic chips and a separate conducting element extending between a logic chip and a power transistor.

FIG. 11 is a top view of a portion of semiconductor device power package 20 including two conducting elements 32. One conducting element 32 electrically connects between logic chips 24 and 26, and a separate conducting element 32 electrically connects between logic chip 26 and a contact of power transistor 30. With additional reference to FIG. 2, conducting elements 32 conform to structured dielectric 54 and chips 24, 26, 30 to form three-dimensional non-planar wiring lines.

In one embodiment, conducting element 32 (e.g., a thin conducting line) and conducting element 36 (e.g., a relatively thick conducting line as shown in FIG. 1) are fabricated concurrently, during the same deposition "run."

In addition, excess metal powder 70 (FIG. 10) has been removed or washed from carrier 22 and leaving behind conducting elements 32. In one embodiment, metal powder 70 is blown off of carrier 22 by a directed jet of air from an air pistol or removed by a vacuum or separated from carrier 22 by any other suitable process. In one embodiment, metal powder 70 is removed from carrier 22 and reused in a subsequent sintering process. It is to be understood that metal powder 70 would generally remain evenly distributed over carrier 22 until fully processed to include a full range of conducting elements electrically connecting components on carrier 22 (as shown in FIG. 1).

FIG. 12 through FIG. 15 are cross-sectional views of a semiconductor device fabricated from a large three-dimensional sintered-fill process according to one embodiment.

FIG. 12 is a cross-sectional view of a device 100 including a leadframe 102, a semiconductor chip 104 attached to leadframe 102, and a structured dielectric 106 patterned on chip 104 and leadframe 102. In one embodiment, structured dielectric 106 is opened to define vias 108, 110, and 112. In one embodiment, vias 108, 110, 112 provide tunnels into dielectric 106 and in other embodiments vias 108, 110, 112 provide channels formed in dielectric 106.

FIG. 13 is a cross-sectional view of metal powder 120 distributed over structured dielectric 106. In one embodiment, metal powder 120 covers a portion of structured dielectric 106 and is deposited into vias 108, 110, 112. Leadframe 102 is similar to carrier 22, semiconductor chip 104 includes chips 24, 26, 28, 30 described above, and metal powder 120 is similar to powder 70 described above.

Figure 14:
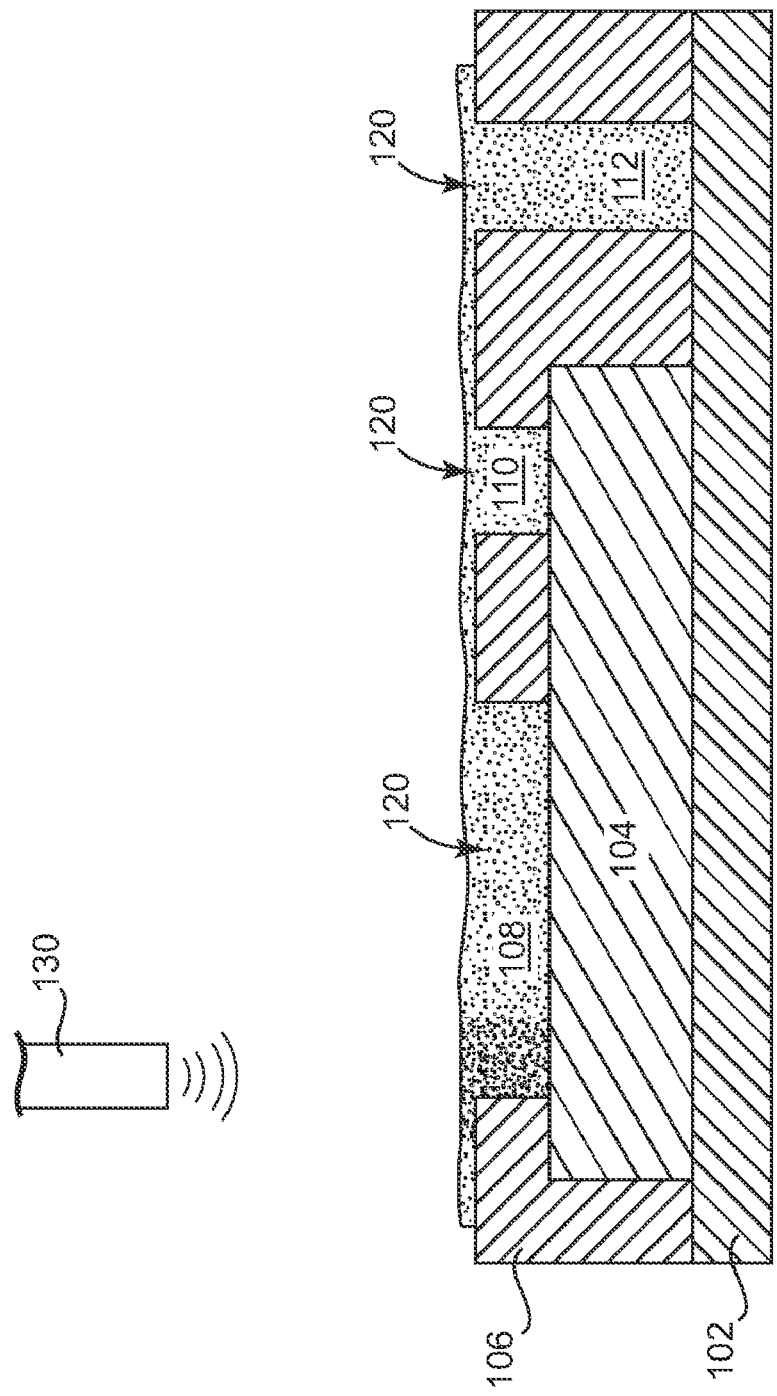
FIG. 14 is a cross-sectional view of a high energy source directed to the metal particles shown in FIG. 13.

FIG. 14 is a cross-sectional view of metal powder 120 deposited into vias 108, 110, 112 and including an energy source 130 directed toward metal powder 120. Structured dielectric 106 is patterned on chip 104 and leadframe 102. Energy source 130 is provided to fuse metal particles 120 into a sintered electrical conducting element. Suitable energy sources include high temperature energy sources, lasers, or other suitable energy sources. In one embodiment, energy source 130 is a Nd:YAG laser that makes multiple passes across metal powder 120 to sinter the powder in the vias 108, 110, 112, such that at least one of the vias has a lateral dimension that is greater than a depth of the via (i.e., the via width is wider than the via depth).

Figure 15:
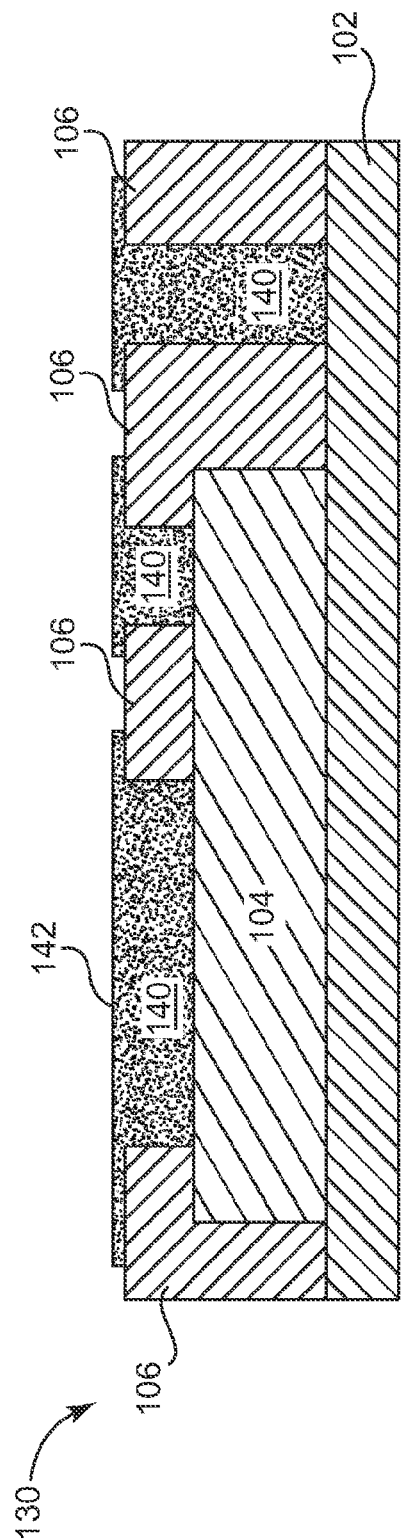
FIG. 15 is a cross-sectional view of a semiconductor device including a sintered metal conductor deposited in the vias shown in FIG. 12.

FIG. 15 is a cross-sectional view of a semiconductor device 130 including sintered metal conductors 140 deposited into respective vias 108, 110, 112 (FIG. 12). Sintered metal conductors 140 include larger scale contacts vertically integrated with device 100. In one embodiment, sintered metal conductors 140 include bumps, structured electrically conducting components deposited on device 130, or other three-dimensional geometries suited for electrical connection with chip 104.

FIG. 16A is a cross-sectional view of metal powder 120 partially deposited into vias 208, 210, 212 and including an energy source 130 directed toward metal powder 120. Structured dielectric 106 patterned on chip 104 and leadframe 102. Energy source 130 is provided to sequentially fuse metal particles 120 into a sintered electrical conducting element over the course of multiple passes. In one embodiment, energy source 130 is a Nd:YAG laser that makes multiple passes across metal powder 120 to sinter the powder in the vias 208, 210, 212.

Figure 16B:
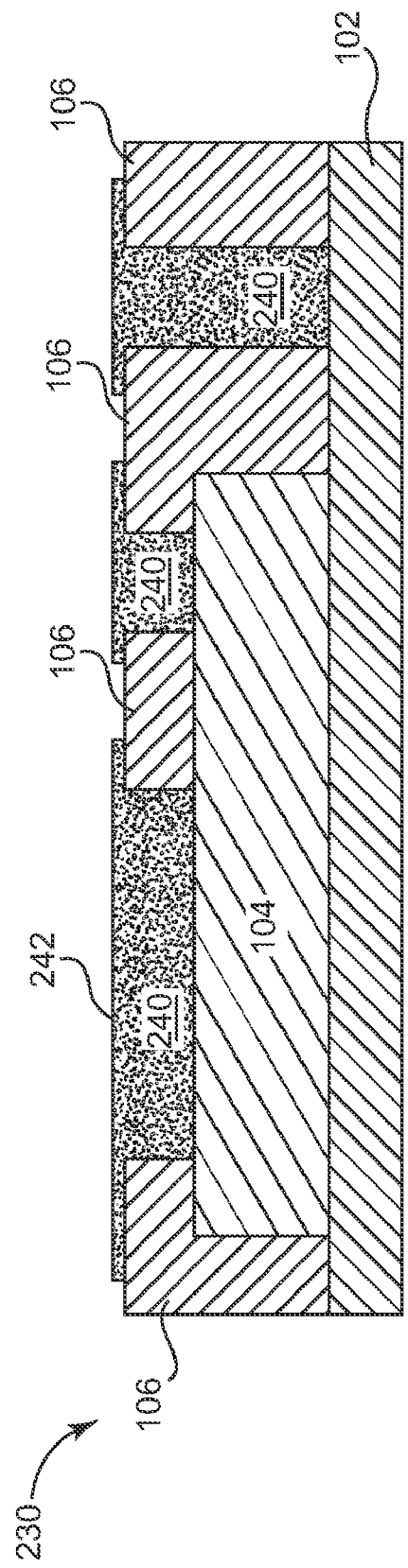
FIG. 16B is a cross-sectional view of a semiconductor device including a sintered metal conductor sequentially deposited in the vias shown in FIG. 16A.

FIG. 16B is a cross-sectional view of a semiconductor device 230 including sintered metal conductors 240 sequentially and concurrently deposited into respective vias 208, 210, 212 (FIG. 12). Sintered metal conductors 240 include larger scale contacts vertically integrated with the semiconductor device having uppermost contact surface 242 in electrical communication with chip 104. In one embodiment, sintered metal conductors 240 include bumps, structured electrically conducting components deposited on device 230, or other three-dimensional geometries suited for electrical connection with chip 104.

Embodiments provide a fully additive process for sintering metal particles into openings, vias, or channels formed in a semiconductor device. Sintered metal conductors 140 provide electrical connection to chip 104 and electrical connection from carrier 102 to the outside world. In one embodiment, semiconductor device 130 is fabricated such that sintered metal 140 provides an uppermost contact surface 142 in electrical communication with chip 104.

Embodiments provide semiconductor devices fabricated to include sintered conducting elements that are produced in a direct process over non-planar structures, sintered conducting elements electrically connected between chips and/or between chips and a carrier of the device, or a direct additive process of sintering metal particles onto a semiconductor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of embodiments of sintered conducting elements formed in an additive process as discussed herein. Therefore, it is intended that this invention be limited only by the claims and the equivalents thereof.

What is claimed is:

1. A semiconductor device comprising:
    a carrier;
    a first chip attached to the carrier;
    a dielectric layer entirely covering the first chip and the carrier, the dielectric layer structured with at least one opening therein aligned with a contact pad of the first chip and at least one opening therein aligned with a contact pad of the carrier; and
    a conducting element disposed on and extending over the structured dielectric, including over the first chip and over the carrier, and disposed within the structured openings so as to be electrically connect to the contact pad of the first chip and to the contact pad of the carrier, the conducting element comprising a sintered conducting element, wherein the conducting element has a thickness, in a direction perpendicular to the carrier, which is in a range from 1 to 5 micrometers and which is less than a thickness of the first chip.

2. The semiconductor device of claim 1, further comprising:
    at least one second chip attached to the carrier, the dielectric layer entirely covering the second chip entirely and having at least one opening therein to a contact pad of the second chip;
    wherein the conducting element extends across the dielectric layer and is disposed in the at least one opening to second chip so that the conducting element is electrically connected to the first chip, the carrier, and to the contact pad of the second chip.

3. The semiconductor device of claim 2, wherein the second chip comprises a power transistor and the conducting element is electrically connected between the power transistor and the carrier, the conducting element comprising a sintered high voltage line.

4. The semiconductor device of claim 2, wherein the first chip comprises a logic chip and the second chip comprises a power transistor that is thinner than the logic chip, and the conducting element comprises a sintered surface-conforming electrical connection extending between the logic chip and the power transistor over a non-planar structured dielectric.

5. The semiconductor device of claim 1, wherein the conducting element is disposed within a via formed in the structured dielectric.

6. A semiconductor power package comprising:
a carrier;
a first chip and a second chip attached to the carrier, the first and second chips laterally spaced apart to form a gap there between;
a dielectric layer completely covering the first and second chips and the carrier, including extending completely across the gap over the carrier between the first and second chips, the dielectric material having at least one through-hole to at least one contact pad on each of the first chip, the second chip, and the carrier;
a first sintered metal line disposed on the dielectric material over the first and second chips and on the dielectric material extending completely across the gap over the carrier between the first and second chips, and within through-holes in the dielectric to the at least one contact pad of each of the first and second chips to electrically connect the first and second chips; and
a second sintered metal line disposed on the dielectric material over the second chip and the carrier and within through-holes in the dielectric material to the at least one contact pad of each of the second chip and carrier to electrically connect the second chip and the carrier, wherein the first and second sintered metal lines have a thickness, in a direction perpendicular to the carrier, in a range from 1 to 5 micrometers and which is less than thicknesses of the first and second chips.

7. The semiconductor device of claim 6, wherein the first sintered metal line comprises a non-planar surface-conforming line conductor having a width that is less than about 50 micrometers.

8. The semiconductor device of claim 7, wherein a portion of the first sintered metal line comprises a column conductor disposed in a via, the via having a lateral dimension that is greater than a depth of the via.

9. The semiconductor device of claim 6, wherein the second sintered metal line comprises a high voltage line conductor having a width between about 50-100 micrometers.

10. The semiconductor device of claim 6, wherein the first chip comprises a logic chip and the second chip comprises a power transistor, the first sintered metal line disposed as a non-planar three-dimensional line connected between the logic chip and the power transistor.

11. The semiconductor device of claim 6, wherein the second sintered metal line is a factor of 10 wider than the first sintered metal line.

12. A semiconductor power package comprising:
a carrier;
a first chip and a second chip attached to the carrier and laterally spaced apart so as to form a gap there between;
a dielectric layer completely covering the first and second chips and the carrier, including extending completely across the gap over the carrier between the first and second chips, the dielectric material having at least one opening to at least one contact pad on each of the first chip, the second chip, and the carrier;
a first metal line electrically connected between the first and second chips and disposed on the dielectric material over the first and second chips and the carrier, and disposed within through-holes to the at least one contact pad on each of the first and second chips;
a second metal line electrically connected between the second chip and the carrier and disposed on the dielectric material over the first and second chips and the carrier and within through-holes to the at least one contact pad on each of the second chip and the carrier, the second metal line wider than the first metal line; and
means for concurrently sintering the first and second metal lines, wherein the first and second sintered metal lines have a thickness, in a direction perpendicular to the carrier, in a range from 1 to 5 micrometers, which is less than thicknesses of the first and second chips.

13. The semiconductor power package of claim 12, wherein the means for concurrently sintering the first and second metal lines comprises an energetic beam configured to sinter the first and second metal lines in a pattern.

14. The semiconductor power package of claim 12, wherein the first chip is spaced apart from the second chip and the first metal line comprises a surface-conforming line formed in the space between the first and second chips.

15. The semiconductor power package of claim 12, wherein the carrier comprises a leadframe, the second chip comprises a power chip, and the second metal line comprises a high voltage connector.

* * * * *